United States Patent
Coleman et al.

(10) Patent No.: US 8,494,025 B2
(45) Date of Patent: Jul. 23, 2013

(54) CURVED COUPLED WAVEGUIDE ARRAY AND LASER

(75) Inventors: James J. Coleman, Monticello, IL (US); Victor C. Elarde, Evanston, IL (US)

(73) Assignee: The Board of Trustees of the Univeristy of Illinois, Urbana, IL (US)

( * ) Notice: Subject to any disclaimer, the term of this patent is extended or adjusted under 35 U.S.C. 154(b) by 0 days.

(21) Appl. No.: 12/598,971

(22) PCT Filed: May 7, 2008

(86) PCT No.: PCT/US2008/005849
§ 371 (c)(1), (2), (4) Date: Mar. 8, 2010

(87) PCT Pub. No.: WO2008/140718
PCT Pub. Date: Nov. 20, 2008

(65) Prior Publication Data
US 2010/0195683 A1    Aug. 5, 2010

Related U.S. Application Data

(60) Provisional application No. 60/928,382, filed on May 9, 2007.

(51) Int. Cl.
*H01S 3/08* (2006.01)
*H01S 5/00* (2006.01)

(52) U.S. Cl.
USPC .................. 372/108; 372/45.01; 372/50.123

(58) Field of Classification Search
None
See application file for complete search history.

(56) References Cited

U.S. PATENT DOCUMENTS

| | | | | |
|---|---|---|---|---|
| 4,742,526 A | * | 5/1988 | Matsui et al. | 372/44.01 |
| 4,760,580 A | * | 7/1988 | Thompson et al. | 372/50.12 |
| 4,809,288 A | * | 2/1989 | Welch et al. | 372/50.12 |
| 4,852,113 A | | 7/1989 | Botez | |
| 4,868,839 A | | 9/1989 | Simmons | |
| 5,050,180 A | * | 9/1991 | Botez et al. | 372/50.123 |
| 5,058,121 A | | 10/1991 | Paoli | |
| 5,070,508 A | | 12/1991 | Hammer | |

(Continued)

OTHER PUBLICATIONS

V.C. Elarde et al., "Curved Waveguide Array Diode Lasers for High-Brightness Applications", Jul. 1, 2008, IEEE Photonics Technology Letters, vol. 20, No. 13, pp. 1085-1087.*

(Continued)

*Primary Examiner* — Armando Rodriguez
*Assistant Examiner* — Sean Hagan
(74) *Attorney, Agent, or Firm* — Greer, Burns & Crain Ltd.

(57) ABSTRACT

A semiconductor laser that includes an active region, claddings and electrical contacts to stimulate emissions from the active region, where a coupled waveguide guides emission. The waveguide includes a broad area straight coupling region that fans out into an array of narrower Individual curved coupled waveguides at an output facet of the laser. The individual curved coupled waveguides are curved according to Lorentzian functions that define the waveguide curvature as a function of position along the device. The integral length of each individual curved coupled waveguide differs from adjacent individual curved coupled waveguides by an odd number of half-wavelengths. The coupled waveguide array shapes the optical field output of the semiconductor laser such that a large fraction of the power is emitted into a small angular distribution using interference phenomena. A laser of the invention produces high power output with a very high quality, narrow beam shape.

19 Claims, 7 Drawing Sheets

U.S. PATENT DOCUMENTS

| | | | |
|---|---|---|---|
| 5,396,511 | A | 3/1995 | Nakatsuka et al. |
| 6,167,072 | A * | 12/2000 | Zory, Jr. ............... 372/43.01 |
| 6,792,180 | B1 * | 9/2004 | Wu ............................ 385/37 |
| 6,816,527 | B2 | 11/2004 | Ueki |
| 6,876,688 | B1 | 4/2005 | Hayakawa et al. |
| 2003/0022456 | A1 | 1/2003 | Callaway |
| 2003/0206741 | A1 | 11/2003 | Ledentsov et al. |
| 2004/0234199 | A1 | 11/2004 | Melloni et al. |

OTHER PUBLICATIONS

Causa, F. et. al, "Observation and Analysis of Phase-Locking in Parabolic Bow-Tie Laser Arrays." *IEEE Journal of Quantum Electronics*, vol. 42, pp. 1016-1022, 2006.

Cheo, P.K. et. al., "A high-brightness laser beam from a phase-locked multicore Yb-doped fiber laser array," *Photonics Technology Letters, IEEE*, vol. 13, pp. 439-441, 2001.

Evans, G.A., et. al. "Coherent, monolithic two-dimensional strained InGaAs/AlGaAs quantum well laser arrays using grating surface emission," *Applied Physics Letters*, vol. 55, pp. 2721-2723, 1989.

Fan, T.Y., "Laser beam combining for high-power, high-radiance sources," *IEEE Journal of Selected Topics in Quantum Electronics*, vol. 11, pp. 567-577, 2005.

Leger. J.R., et. al., "Coherent addition of AlGaAs lasers using microlenses and diffractive coupling," *Applied Physics Letters*, vol. 52, pp. 1771-1773, 1988.

Streifer, W., et. al., "Y-Junction semiconductor laser arrays: Part I—Theory", *IEEE Journal of Quantum Electronics*, vol. 23, pp. 744-751, 1987.

Welch, D., et. al., "Y-Junction semiconductor laser arrays: Part II—Experiments," *IEEE Journal of Quantum Electronics*, vol. 23, pp. 752-756, 1987.

* cited by examiner

*Waveguide Curvature*

# CURVED COUPLED WAVEGUIDE ARRAY AND LASER

PRIORITY CLAIM AND REFERENCE TO RELATED APPLICATION

This application claims priority under 35 U.S.C. §119 from prior provisional application Ser. No. 60/928,382, filed May 9, 2008.

FIELD

A field of the invention is semiconductor lasers.

BACKGROUND

Coherent laser arrays are capable of delivering significantly higher brightness than uncoupled arrays due to the significantly narrower far-field characteristics resulting from constructive interference of the individual emitters. Techniques for spectrally and spatially combining the outputs of individual elements of semiconductor laser arrays have been heavily researched, as artisans work toward the ultimate goal of producing high-power laser systems with high beam quality. Methods for achieving this have ranged from closely packing single-mode fiber lasers into an array, to the use of microlenses and diffraction gratings in order to coherently couple multiple semiconductor lasers. Spatial beam combination techniques have the advantage of operating at a single output frequency and are ideal for pumping applications such as for Er-doped fiber amplifiers.

Coupled semiconductor laser arrays have been studied for at least the last 20 years. Many methods of providing coherent coupling among elements of the array use external lenses and mirrors to provide feedback between adjacent elements. See, e.g., Leger, et. al., "Coherent addition of AlGaAs lasers using microlenses and diffractive coupling," Applied Physics Letters, vol. 52, pp. 1771-1773, 1988. While this technique has been demonstrated to work, the fabrication is complicated by the need for several discrete components and precision alignment between these components must be achieved. Another technique for obtaining coupled output arrays from semiconductor laser diodes is the use of gratings which couple light out perpendicular to the plane of the wafer. An example is work concerning two-dimensional arrays of surface emitters that demonstrated coherent emission. Evans, et. al., "Coherent, monolithic two-dimensional strained InGaAs/AlGaAs quantum well laser arrays using grating surface emission," Applied Physics Letters, vol. 55, pp. 2721-2723, 1989. Loss mechanisms associated with the gratings reduce achievable power output and device reliability. Fabrication is also relatively complex.

Fiber laser arrays can also be used to coherently combine the output of several discrete lasers. See, Cheo, et. al., "A high-brightness laser beam from a phase-locked multicore Yb-doped fiber laser array," Photonics Technology Letters, IEEE, vol. 13, pp. 439-441, 2001. Their system combined the output of several fiber lasers in a two dimensional array. This configuration is able to achieve in phase coupling, resulting in a high quality output beam. There are, however, several disadvantages to using fiber lasers over using semiconductor diode lasers. First of all, there is an inherent inefficiency due to the fact that the fiber laser must be pumped by another optical source, typically a diode laser. Assembly of the fiber laser system is also significantly more complicated than the fabrication monolithically integrated lasers.

Combining of individual elements of semiconductor laser diodes has been attempted using several different techniques in recent years. See, Fan "Laser beam combining for high-power, high-radiance sources," IEEE Journal of Selected Topics in Quantum Electronics, vol. 11, pp. 567-577, 2005. An array of parabolic bow-tie laser is another structure that has been employed. Causa et al., "Observation and Analysis of Phase-Locking in Parabolic Bow-Tie Laser Arrays," IEEE Journal of Quantum Electronics, vol. 42, pp. 1016-1022, 2006. Under certain operating conditions, these devices achieve in-phase coupling. Under other conditions, however, the devices demonstrate out of phase coupling, indicating a certain level of instability in the coupling characteristics of the individual devices. This type of behavior is typical of evanescently coupled semiconductor laser arrays. Y-junction coupled semiconductor laser arrays have also been used to achieve in-phase coupled high-brightness arrays. See, Streifer et al., "Y-Junction semiconductor laser arrays: Part I—Theory," IEEE Journal of Quantum Electronics, vol. 23, pp. 744-751, 1987; Welch et al, "Y-Junction semiconductor laser arrays: Part II—Experiments," IEEE Journal of Quantum Electronics, vol. 23, pp. 752-756, 1987. In this method, an array of narrow stripe semiconductor lasers is coupled together by a series of Y-junctions. This structure can be tuned to select the in-phase mode by ensuring that mode has the minimum loss.

SUMMARY OF THE INVENTION

An embodiment of the invention is a semiconductor laser that includes an active region, claddings and electrical contacts to stimulate emissions from the active region. A waveguide guides emission from the active region. The waveguide includes a broad area straight coupling region that fans out into an array of narrower individual curved coupled waveguides at an output facet of the laser. The individual curved coupled waveguides are curved according to Lorentzian functions that define the waveguide curvature as a function of position along the device. The integral length of each individual curved coupled waveguide differs from adjacent individual curved coupled waveguides by an odd number of half-wavelengths. The coupled waveguide array shapes the optical field output of the semiconductor laser such that a large fraction of the power is emitted into a small angular distribution using interference phenomena. A laser of the invention produces high power output with a very high quality, narrow beam shape. The curved waveguide array produces a coherent array of output components. High power is achieved because the total power is distributed over multiple output components, and the output components combine via interference to form a narrow output beam. The waveguide distributes power generation over many components and coherently recombines the components into a single beam, achieving high brightness.

DETAILED DESCRIPTION OF THE PREFERRED EMBODIMENTS

Figure 1:
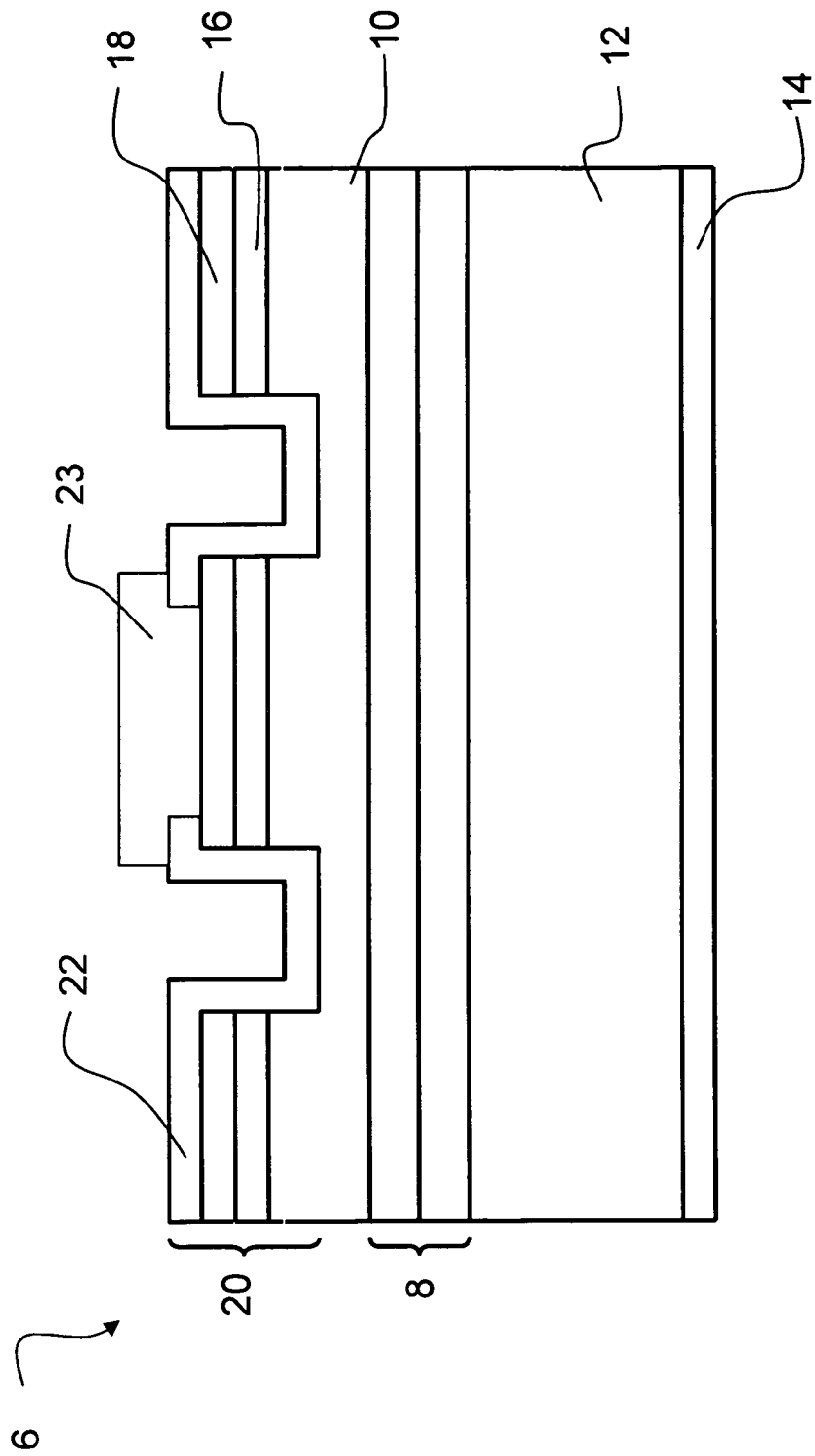
FIG. 1 is a schematic side representation of a curved coupled array laser of the invention.

An embodiment of the invention is a semiconductor laser including a curved coupled waveguide array. The coupled waveguide array shapes the optical field output of the semiconductor laser such that a large fraction of the power is emitted into a small angular distribution using interference phenomena. A laser of the invention produces high power output with a very high quality, narrow beam shape. The curved waveguide array produces a coherent array of output components. High power is achieved because the total power is distributed over multiple output components, and the output components from separate emitters combine via interference to form a narrow output beam. The waveguide distributes power generation over many components and coherently recombines the components into a single beam, achieving high brightness.

An embodiment of the invention is a semiconductor laser that includes an active region, claddings and electrical contacts to stimulate emissions from the active region. A waveguide guides emission from the active region. The waveguide includes a broad area straight coupling region that fans out into an array of narrower individual curved coupled waveguides at an output facet of the laser. The individual curved coupled waveguides are curved according to Lorentzian functions that define the waveguide curvature as a function of position along the device. The integral length of each individual curved coupled waveguide differs from adjacent individual curved coupled waveguides by an odd number of half-wavelengths.

Curved coupled waveguide array laser of the invention can be formed with a fabrication process that is entirely compatible with industry standard semiconductor laser fabrication techniques. A simple to implement fabrication process of the invention requires only two lithographic steps. Devices are therefore readily manufacturable in large scale fabrication processes.

Devices of the invention can advantageously be monolithically integrated and are relatively simple to fabricate. Strong coupling achieved in the broad area region of the devices of the invention produce a very stable in-phase output over a wide range of operating conditions.

Preferred embodiments of the invention will now be discussed with respect to the drawings and with respect to experiments and calculations. The drawings include schematic representations, which will be understood by artisans in view of the general knowledge in the art and the description that follows. Features may be exaggerated in the drawings for emphasis, and features are not be to scale. Coupled waveguide structures of the invention for high brightness applications can achieve a nearly diffraction limited divergence angle through coherent spatial beam combination. Far-field measurements of prototype devices show strong interference effects, yielding a very narrow, on-axis central lobe. Theoretical calculations have also been carried out, and demonstrate the potential of this type of coherent array to exceed that of an uncoupled array by greater than an order of magnitude in terms of maximum achievable brightness. These calculations as well as experimental data will be presented herein in describing example embodiments. Artisans will recognize broader aspects of the invention from the following description, as well as additional features of preferred embodiments. Artisans will particularly appreciate that the invention is not limited to the selected materials. Other active semi-conductor materials can also be used. Unless otherwise indicated, dimensions are exemplary only.

FIG. 1 is a schematic side cross-section representation of a curved couple array laser 6 of the invention. The laser 6 includes a core 8 as an active region. In example embodiments, the core includes a quantum well and associated upper and lower barrier layers. Upper 10 and lower 12 claddings are around the core 8, and a lower contact 14 is isolated by the lower cladding 12. A barrier reduction layer 16 is upon the upper cladding 10 and is capped by a cap layer 18. A curved waveguide array 20 is formed into the upper layers of the laser 6 with a pattern, such as by optical lithographic definition to form a waveguide pattern (such as that illustrated in FIG. 3). An insulator layer 22, e.g. a layer of $SiO_2$ has etched stripes directly above, and slightly narrower than, the previously patterned ridges of the waveguide 20 into which a top electrode 23 is deposited. An example top electrode 23 is a multilayer contact consisting of Ti, Pt, and Au.

Figure 2:
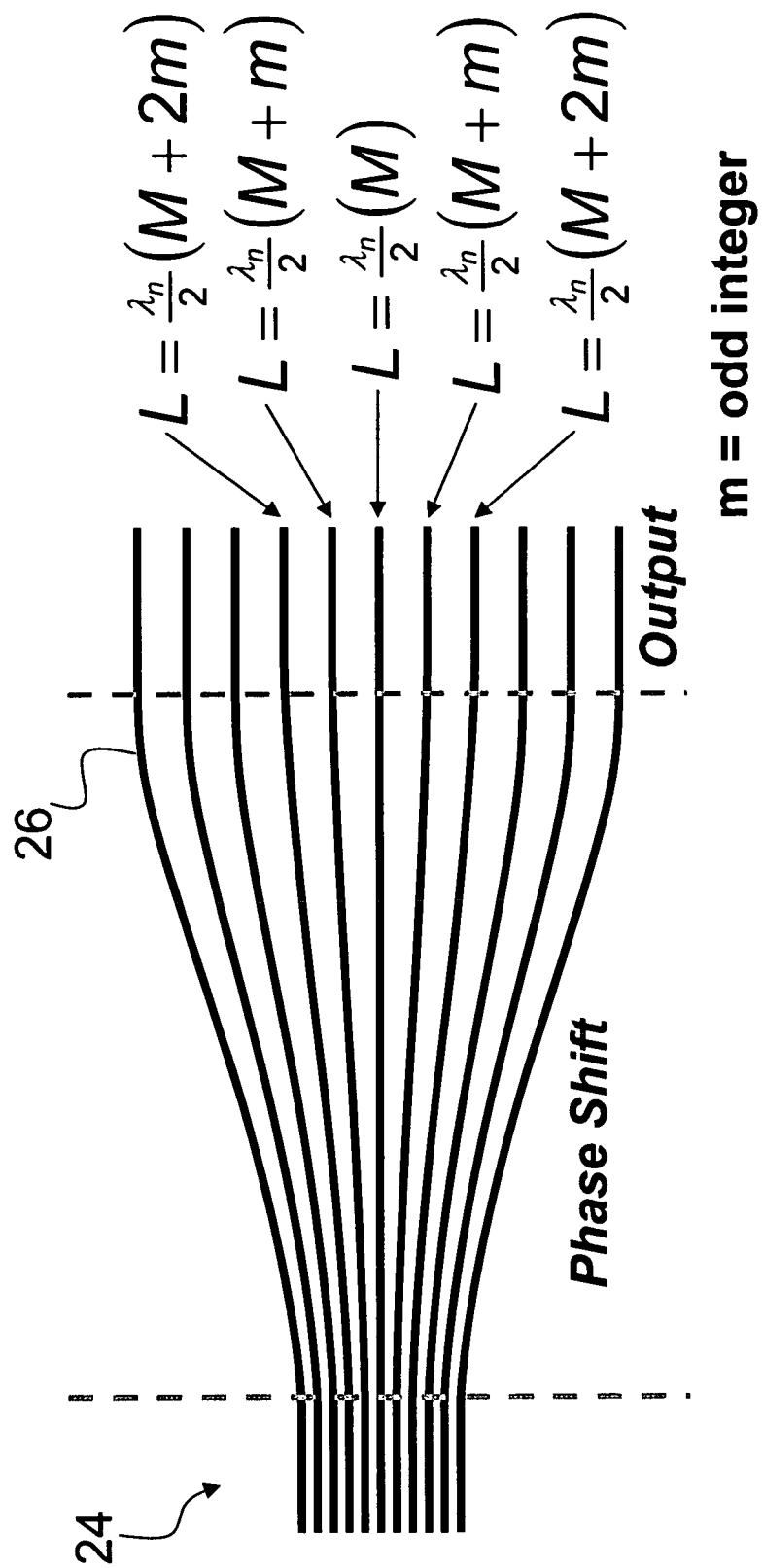
FIG. 2 illustrates the shape of the curved portion of the waveguide in the preferred embodiment laser of FIG. 1.

FIG. 2 illustrates the shape of the waveguide 20 of the laser as viewed from the top surface of the laser, and presents the mathematical relationship among the curved coupled array of waveguides. The waveguide includes a broad area straight coupling region 24 that fans out into an array of narrower individual curved coupled waveguides 26 at an output facet the of the laser. The electrode 23 (see FIG. 1) can be a single electrode over the entire length of the laser (0-2000) or there could separate electrodes, such as an electrode for the straight region 24 and separate electrode(s) for the curved coupled waveguides 26.

The individual curved coupled waveguides 26 are curved according to Lorentzian functions that define the waveguide curvature as a function of position along the device. The integral length of each individual curved coupled waveguide 26 differs from adjacent individual curved coupled waveguides by an odd number of half-wavelengths. The length is measured from facet to facet along the curved path of light propagation. Each curved path of light propagation can be considered as a separate laser/emitter, and in the near field a corresponding number of emitter are apparent at an output facet 27. Specifically, a central one of the curve coupled waveguides has a path length L, defined as:

$$L = \frac{\lambda_n}{2}(M) \tag{1}$$

The two waveguides adjacent the central waveguide will have a path length, L defined by:

$$L = \frac{\lambda_n}{2}(M+m) \tag{2}$$

The next two away from the center waveguide will have a length defined as:

$$L = \frac{\lambda_n}{2}(M + 2m) \quad (3)$$

M is the order of the central guide, m is an odd integer, and $\lambda_n$ is the wavelength of the nth emitter. Additional waveguides have a length the follows the series The coupled waveguide array shapes the optical field output of the semiconductor laser such that a large fraction of the power is emitted into a small angular distribution using interference phenomena. A laser of the invention produces high power output with a very high quality, narrow beam shape. The curved waveguide array produces a coherent array of output components. High power is achieved because the total power is distributed to over multiple output components, and the output components combine via interference to form a narrow output beam. The waveguide distributes power generation over many components and coherently recombines the components into a single beam, achieving high brightness.

Each successive waveguide away from the central one is curved more than the previous such that its integrated path length exceeds that of the previous one by an odd number of half-wavelengths in the material. This design results in slightly different Fabry-Perot mode spacings for each waveguide, with perfect alignment achieved only at the design wavelength. In a cavity with a sufficiently high quality factor, the Fabry-Perot modes are narrow enough that significant preference is afforded to the single resonance that is shared among all the waveguides. The differential length of an odd number of half-wavelengths causes the output of each waveguide to be in-phase at this operating wavelength.

Figure 3:
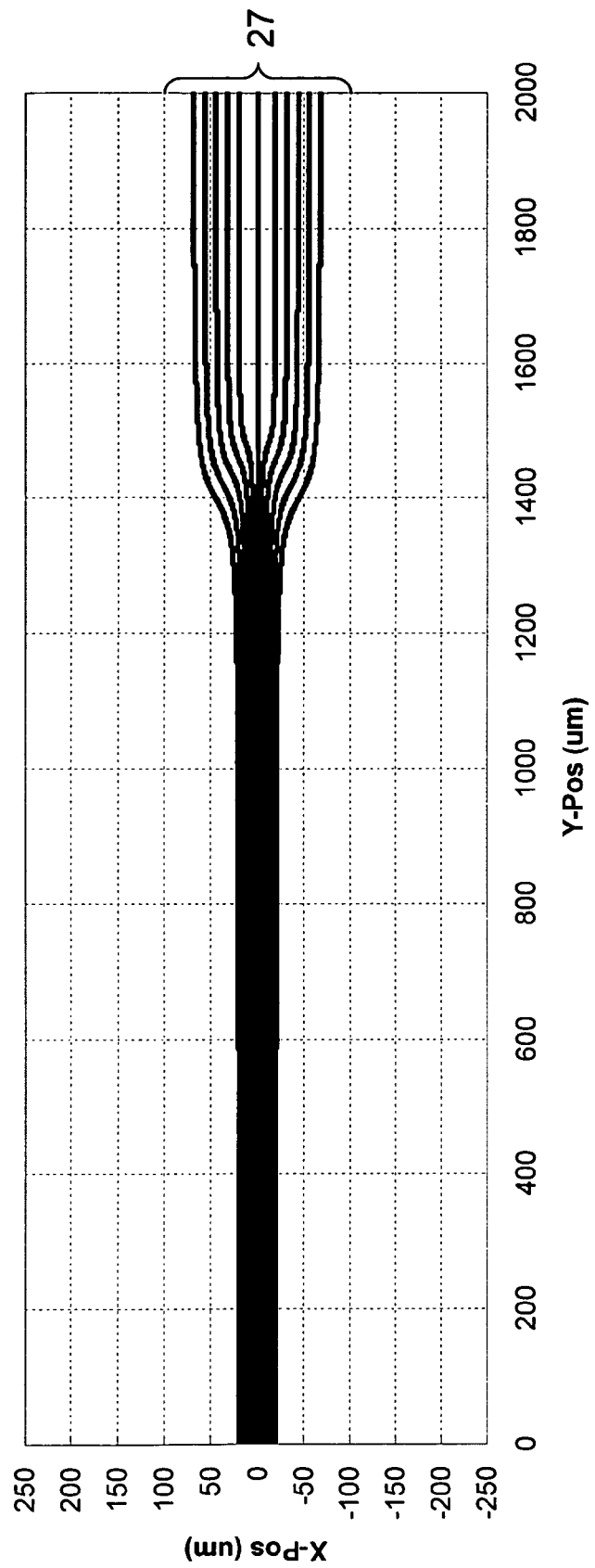
FIG. 3 illustrates an example waveguide of the invention that also illustrates the general shape of the waveguide in the preferred embodiment laser of FIG. 1; steps appearing in FIGS. 3, 7 and 8 are a result of the inability of a standard printer to faithfully reproduce the smooth curvature of the waveguides.
Figure 7:
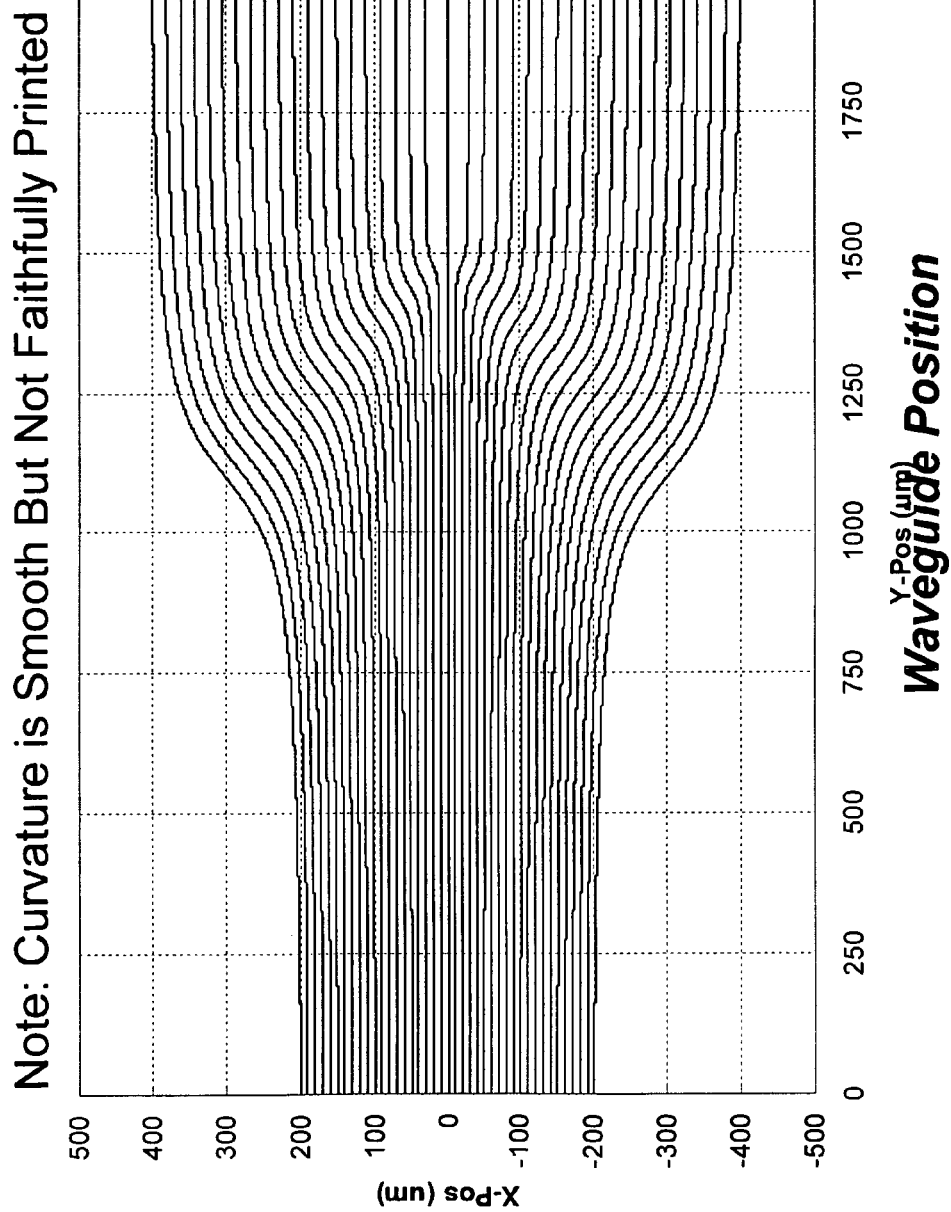
FIG. 7 shows the waveguide position over the path of light propagation for the FIG. 6 embodiment.

FIG. 3 provides a particular example that also illustrates the general shape of the waveguide in the preferred embodiment laser. It is noted that the shape is a smooth curvature. Steps appearing in FIGS. 3, 7 and 8 are a result of the inability of a standard printer to faithfully reproduce the smooth curvature of the waveguides. The example waveguide of FIG. 3 is consisting of a broad area coupling region 24 that is 44 µm in width, which diverges into an array of 11 individual 4 µm width waveguides 26 at the output facet 28. The total length of the waveguide is 2000 µm. In a ridge waveguide design, the FIG. 3 embodiment provided optimum performance. The integral length of each waveguide differs from those adjacent by an odd number of half-wavelengths. Additional features of preferred embodiments and advantages will be appreciated from experimental prototypes that were fabricated and tested.

Example Prototype Fabrication

An example prototype epitaxial structure for the waveguide arrays is an asymmetric cladding double heterostructure design that is consistent with the laser 6 illustrated in FIG. 1. The example prototype included a 1 µm $Al_{0.12}Ga_{0.88}As$ core containing a 9 nm, single $In_{0.2}Ga_{0.8}As$ quantum well with 10 nm GaAs interface (barrier layers separating the core from the quantum well). The lower and upper claddings were composed of $Al_{0.35}Ga_{0.65}As$ and were 1 µm and 400 nm, respectively. A 100 nm, linearly graded ($Al_{0.35}Ga_{0.65}As$ to GaAs) barrier reduction layer followed by a 100 nm, GaAs, Zn-doped P-cap layer complete the structure.

The waveguide arrays were fabricated using an optical lithographic definition of the waveguide pattern illustrated in FIG. 3, followed by a ~500 nm deep wet etch in 1:8:80 $H_2SO_4:H_2O_2:H_2O$. A layer of $SiO_2$ was then deposited using plasma-enhanced chemical vapor deposition (PECVD). Stripes were etched into the $SiO_2$ directly above, and slightly narrower than, the previously patterned ridges to allow current injection into the device. Top contact metals were then deposited, consisting of Ti, Pt, and Au. The sample was then thinned to facilitate cleaving, and back side contacts were deposited consisting of Ge:Au, Ni, and Au. Finally, the samples were cleaved and diced into individual devices for testing.

Output Mode Beam Shape Measurements

Figure 4:
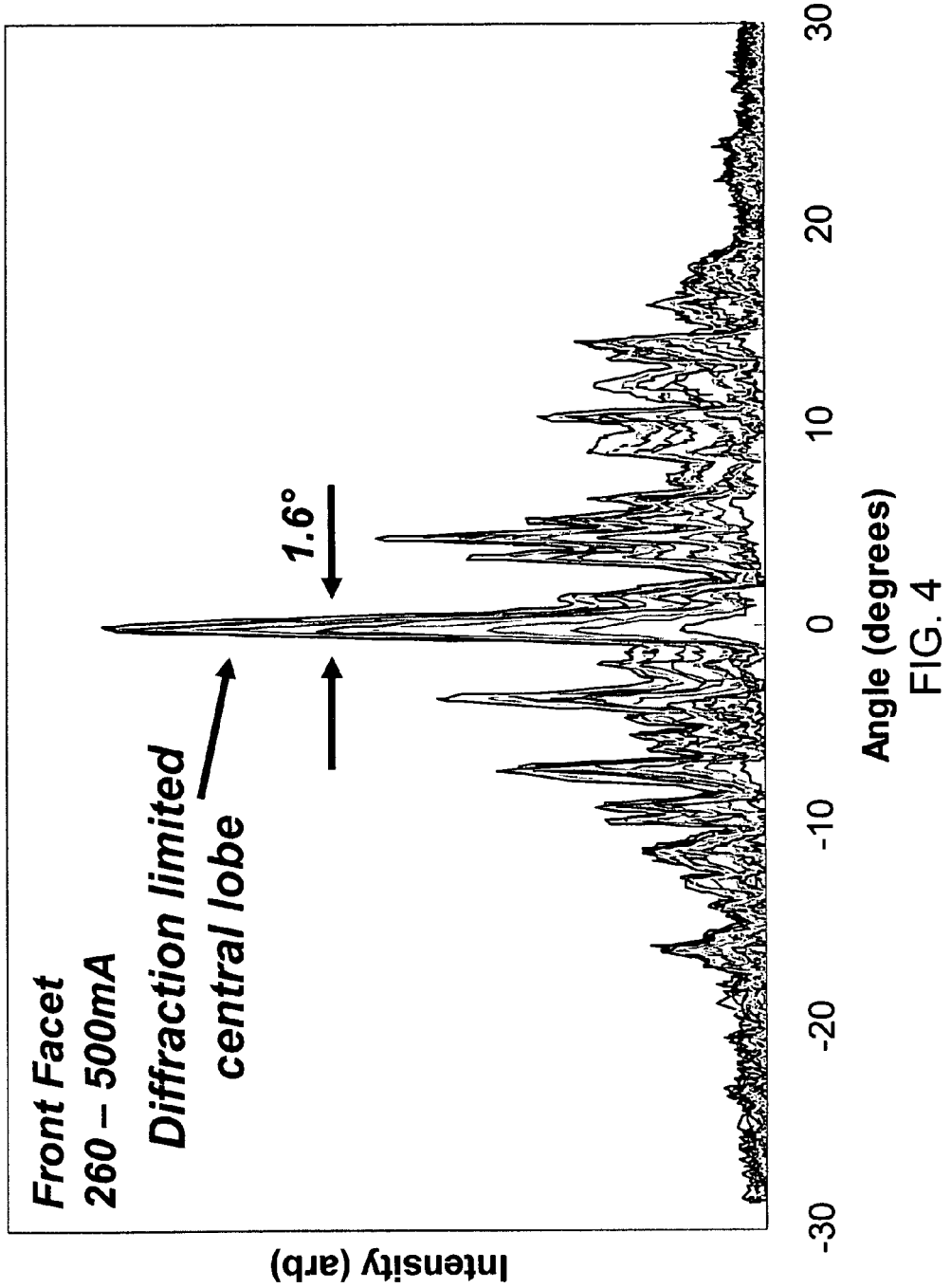
FIG. 4 provides measured far-field data from an experimental prototype laser of the invention.

Far-field (FIG. 4) data was taken for the experimental devices under pulsed current conditions (0.3% duty cycle, 2 µs pulse width). The near-field profile was observed and contained 11 distinct output lobes, corresponding to the 11 separate emitters. The far-field profile contains many distinct peaks, with a strong, narrow, on-axis central lobe. The far-field pattern was consistent over input currents ranging from threshold (212 mA) to 500 mA. The 1/e width of the central lobe at 500 mA was 1.6° which is approximately the diffraction limit for an array of 11, 4 µm wide emitters at the operating wavelength. The series of far-field patterns were measured under pulsed current injection ranging from 260 to 500 mA in 20 mA increments. Near field images of the output revealed 11 individual output spots.

Figure 5:
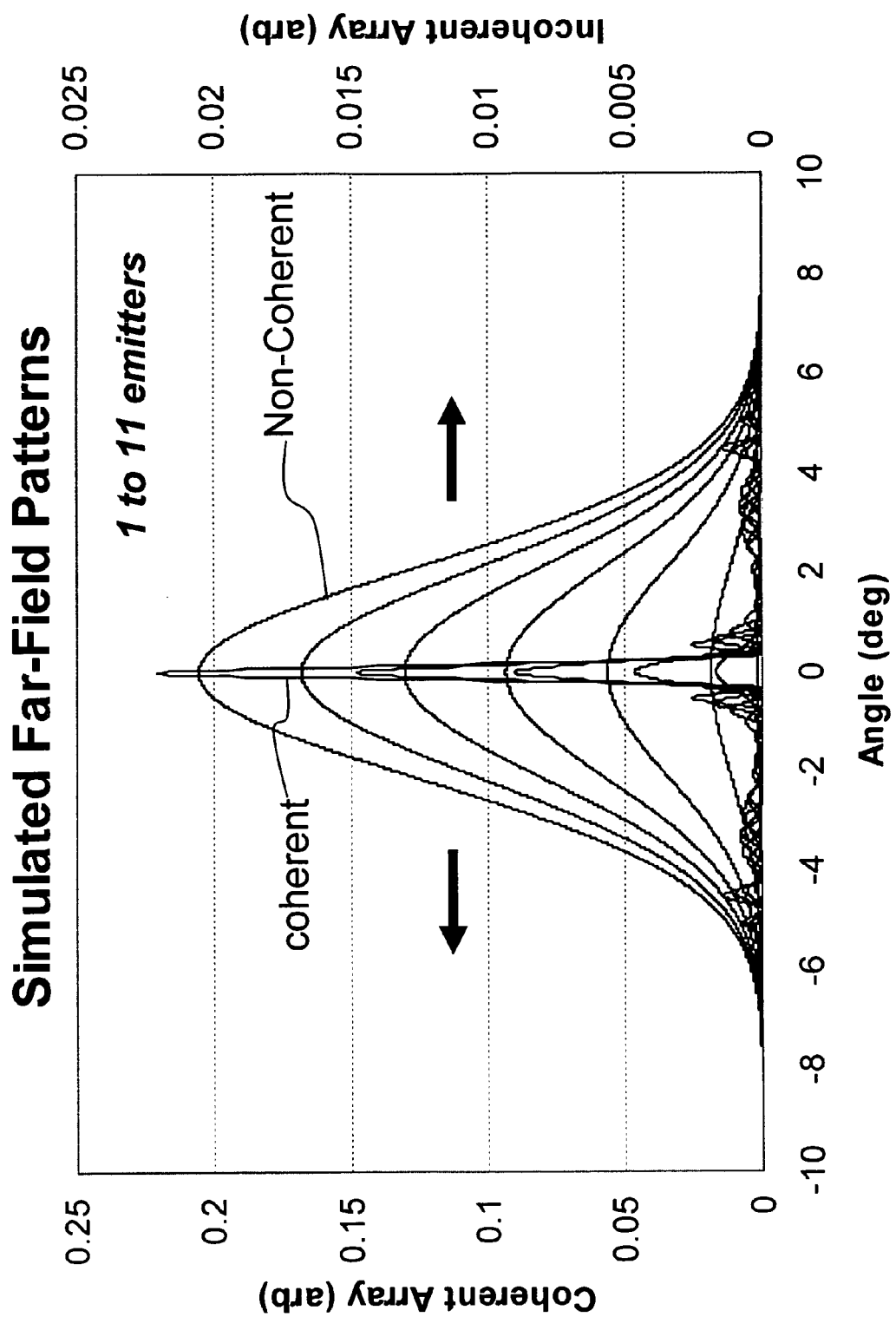
FIG. 5 is derived from calculations of the beam width and brightness of coherent and incoherent arrays for varying numbers of emitters.

Theoretically, coherent arrays such as the FIG. 3 array should be capable of producing significantly higher brightness than uncoupled arrays with the same amount of output power per emitter and identical lateral beam profiles for each emitter. The data in FIG. 5 are derived from calculations of the beam width and brightness of coherent and incoherent arrays of this type for varying number of emitters. The coherent array loses some power to the side lobes present in the far-field pattern, however the reduction in width of the central lobe overcomes this loss to achieve significantly higher brightness (by a factor of 40 for the case of 41 emitters) than the incoherent case.

Figure 6:
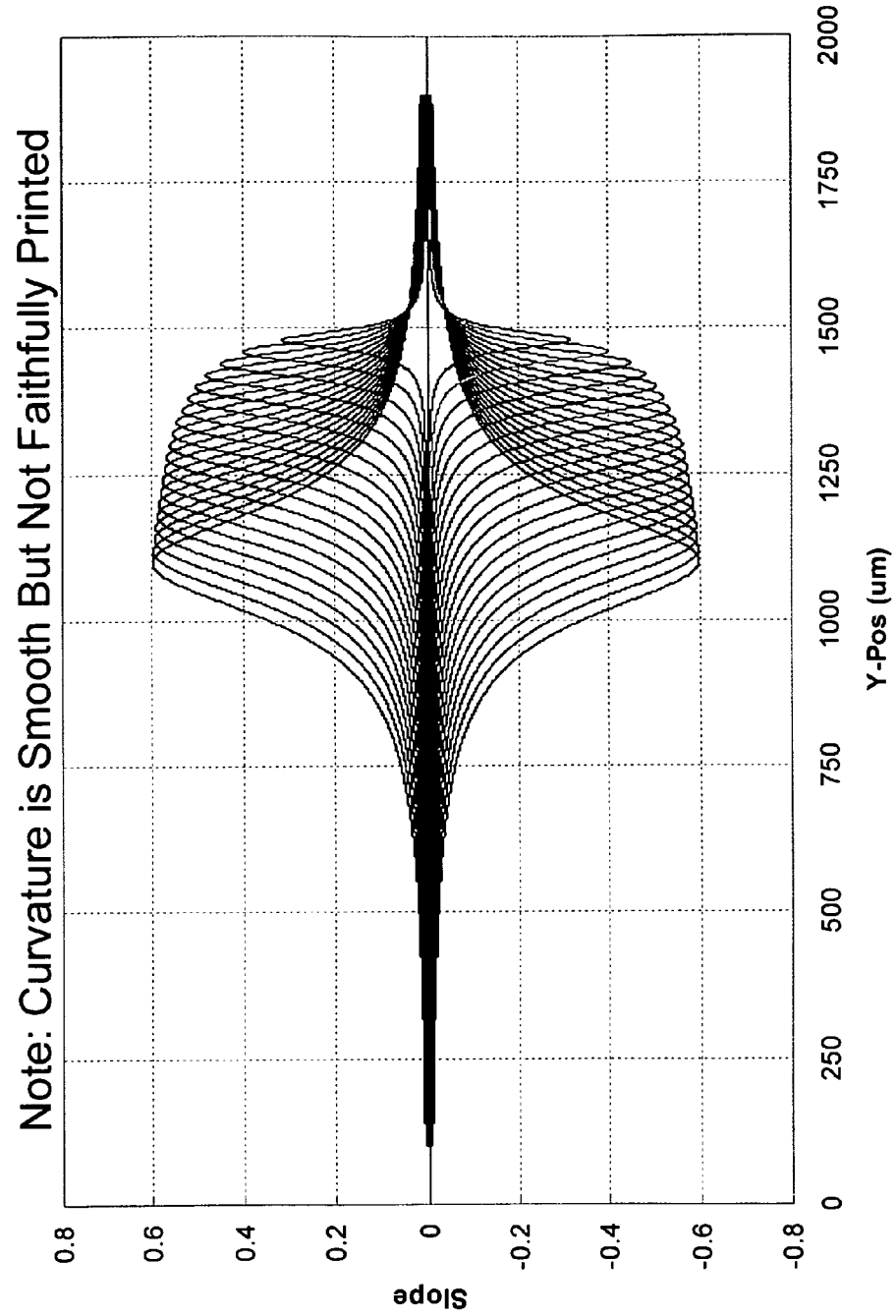
FIG. 6 shows the calculated slope of waveguide curvature for an embodiment of the invention including 41 curved waveguides as a function of position.

Other simulation data showed that the coherent array achieves a higher brightness than the incoherent array by a factor of 40 for the case of 41 curved waveguides/emitters even including the loss of power to side-lobes. FIGS. 6 and 7 illustrate a waveguide design in accordance with the invention for a 41 emitter design. FIG. 6 shows the calculated slope of waveguide curvature for the 41 waveguides as a function of position, and FIG. 7 shows the waveguide position over the path of light propagation. Steps appearing in FIGS. 7 and 8 are a result of the inability of a standard printer to faithfully reproduce the smooth curvature of the waveguides. The calculated curvature function represents Lorentzian functions consistent with the series presented in Equations 1-3 above. The magnitude is adjusted by a numerical computation to set the integrated waveguide length to odd ordered increments, and the calculation can be exported directly to a CAD program for providing the physical layout of the waveguide.

The curved coupled waveguide array of the invention is clearly suitable for high brightness applications which use coherent spatial beam combination to achieve very narrow output divergence angle. Far-field measurements of these devices demonstrate strong in-phase coupling resulting in a nearly diffraction limited output beam.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A semiconductor laser, comprising:
an active region, claddings and electrical contacts to stimulate emissions from the active region; and
a waveguide guiding emission from the active region, the waveguide comprising a broad area straight coupling region that fans out into an array of narrower individual curved coupled waveguides at an output facet of the laser, wherein the individual curved coupled waveguides are curved according to Lorentzian functions that define the waveguide curvature as a function of position along the device and the integral length of each individual curved coupled waveguide differs from adjacent individual curved coupled waveguides by an odd number of half-wavelengths, such that the waveguide commences as a multimode waveguide at a back facet of the broad area straight coupling region that transitions into the array of single-mode waveguides at the output facet.

2. The laser of claim 1, wherein the waveguide comprises a ridge waveguide.

3. The laser of claim 1, wherein the path length of the curved waveguides is defined in accordance with the relationship below:
a central one of the curve coupled waveguides has a path length L, defined as:

$$L = \frac{\lambda_n}{2}(M)$$

two waveguides adjacent the central waveguide will has a path length, L defined by:

$$L = \frac{\lambda_n}{2}(M + m)$$

The next two away from the center waveguide has a path length defined as:

$$L = \frac{\lambda_n}{2}(M + 2m)$$

M is the order of the central guide, and m is an odd integer.

4. The laser according to claim 3, wherein:
the laser comprises an asymmetric cladding double heterostructure laser.

5. The laser according to claim 4, wherein the active region comprises a quantum well.

6. The laser according to claim 5, wherein the quantum well comprises InGaAs with GaAs barrier layers, and an AlGaAs core, the laser further comprising lower and upper claddings of AlGaAs, a linearly graded AlGaAs to GaAs barrier reduction layer and a GaAs, Zn-doped P-cap layer.

7. A waveguide in an integrated optoelectronic device, the waveguide comprising a broad area straight coupling region that fans out into an array of narrower individual curved coupled waveguides at an output facet, wherein the individual curved coupled waveguides are curved according to Lorentzian functions that define the waveguide curvature as a function of position along the device and the integral length of each individual curved coupled waveguide differs from adjacent individual curved coupled waveguides by an odd number of half-wavelengths, such that the waveguide commences as a multimode waveguide at a back facet of the broad area straight coupling region that transitions into the array of single-mode waveguides at the output facet.

8. The waveguide of claim 7, wherein the waveguide comprises a ridge waveguide.

9. The waveguide of claim 7, wherein the path length of the curved waveguides is defined in accordance with the relationship below:
a central one of the curve coupled waveguides has a path length L, defined as:

$$L = \frac{\lambda_n}{2}(M)$$

two waveguides adjacent the central waveguide will has a path length, L defined by:

$$L = \frac{\lambda_n}{2}(M + m)$$

The next two away from the center waveguide has a path length defined as:

$$L = \frac{\lambda_n}{2}(M + 2m)$$

M is the order of the central guide, and m is an odd integer.

10. The laser according to claim 9, wherein:
the laser comprises an asymmetric cladding double heterostructure laser.

11. A semiconductor laser, comprising:
an active region, claddings and electrical contacts to stimulate emissions from the active region;
means for distributing laser power of plurality of near field spectral output components at an output aperture of the laser, wherein the output components combine in far field via interference to form a narrow output beam.

12. The laser of claim 1, wherein said broad area straight coupling region terminates in a broad straight waveguide opposite its portion that fans out into an array of narrower individual curved coupled waveguides at the output facet of the laser.

13. The laser of claim 1, wherein said broad area straight coupling region extends to a back facet of the laser opposite the output facet of the laser.

14. The laser of claim 1, wherein said broad area straight coupling region is substantially longer than the array of narrower individual curved coup led waveguides.

15. The laser of claim 1, wherein said broad area straight coupling region has a width that is substantially equal to the total sum of widths of the narrower individual curved coupled waveguides.

16. The waveguide of claim 7, wherein said broad area straight coupling region terminates in a broad straight waveguide opposite its portion that fans out into an array of narrower individual curved coupled waveguides at the output facet.

17. The laser of claim 1, wherein said broad area straight coupling region extends to a back facet opposite the output facet.

18. The waveguide of claim 7, wherein said broad area straight coupling region is substantially longer than the array of narrower individual curved coupled waveguides.

19. The waveguide of claim 7, wherein said broad area straight coupling region has a width that is substantially equal to the total sum of widths of the narrower individual curved coupled waveguides.

* * * * *